(12) United States Patent
Fan et al.

(10) Patent No.: US 10,178,765 B2
(45) Date of Patent: Jan. 8, 2019

(54) ELECTRONIC DEVICE AND FLEXIBLE DEVICE

(71) Applicant: Lenovo (Beijing) Co., Ltd., Beijing (CN)

(72) Inventors: Xiaoli Fan, Beijing (CN); Xiaoqin Han, Beijing (CN); Lei Ma, Beijing (CN); Changlong Zuo, Beijing (CN)

(73) Assignee: Lenovo (Beijing) Co., Ltd., Beijing (CN)

( * ) Notice: Subject to any disclaimer, the term of this patent is extended or adjusted under 35 U.S.C. 154(b) by 402 days.

(21) Appl. No.: 14/978,787

(22) Filed: Dec. 22, 2015

(65) Prior Publication Data
US 2017/0094775 A1  Mar. 30, 2017

(30) Foreign Application Priority Data

Sep. 30, 2015  (CN) .......................... 2015 1 0640518

(51) Int. Cl.
*B32B 3/24* (2006.01)
*H05K 1/02* (2006.01)
*G06F 1/16* (2006.01)
*G09F 9/30* (2006.01)

(52) U.S. Cl.
CPC ........... *H05K 1/028* (2013.01); *G06F 1/1652* (2013.01); *G06F 1/1681* (2013.01); *G09F 9/301* (2013.01)

(58) Field of Classification Search
CPC ................................ F16G 13/08; B66C 1/125

USPC ..... 474/215, 229; 59/84; 198/850, 851, 852, 198/853
See application file for complete search history.

(56) References Cited

U.S. PATENT DOCUMENTS

| | | | |
|---|---|---|---|
| 7,464,810 B2 * | 12/2008 | Vietoris | F16G 13/02 198/850 |
| 9,164,547 B1 * | 10/2015 | Kwon | G06F 1/1656 |
| 2008/0176693 A1 * | 7/2008 | Teubert | F16G 13/06 474/229 |

* cited by examiner

*Primary Examiner* — William P Watkins, III
(74) *Attorney, Agent, or Firm* — Harness, Dickey & Pierce, P.L.C.

(57) ABSTRACT

A flexible device is provided according to the present application, which includes a first sliding shaft, a second sliding shaft, a middle sliding shaft group and a connecting member group. The middle sliding shaft group includes multiple middle sliding shafts arranged in rows. The middle sliding shaft group is movably connected to the first sliding shaft and the second sliding shaft by the connecting member group. The flexible device can be bent along an extending direction of the middle sliding shaft group, and a bent portion of the flexible device is always of an arc-shaped structure. The flexible device according to the present application adopts a mechanical structure to realize a bending deformation thus can avoid problems of a degraded bending performance and breakage generated after the flexible device is frequently used in the conventional technology. An electronic device employing the flexible device is further provided.

16 Claims, 17 Drawing Sheets

ELECTRONIC DEVICE AND FLEXIBLE DEVICE

This application claims the benefit of priority to Chinese Patent Application No. 201510640518.6 titled "ELECTRONIC DEVICE AND FLEXIBLE DEVICE" filed with the Chinese State Intellectual Property Office on Sep. 30, 2015, the entire disclosure of which is incorporated herein by reference.

FIELD

The present application relates to the technical field of mechanical industry, more particularly to a flexible device, and further relates to an electronic device using the flexible device.

BACKGROUND

With the development of society, electronic devices have been more and more widely used in people's production and life.

Currently, a display screen in the electronic device includes a flexible screen which is bendable and deformable, however, a device for supporting the flexible screen is configured as a plastic plate, after the flexible device is frequently used, the plastic plate is apt to generate a stress hardening, and then cannot be smoothly bent, and may even be broken, thus adversely affecting a service life of the flexible screen.

Therefore, issues to be urgently addressed by those skilled in the art are to provide a flexible device, to avoid the problems of a degraded bending performance and breakage generated after the flexible device is used for a long time of the plastic plate, and to provide an electronic device using the flexible device.

SUMMARY

In view of this, a flexible device is provided according to the present application, which adopts a mechanical structure to realize a bending deformation, and, compared with a plastic plate, can avoid the problems of a degraded bending performance and breakage generated after the flexible device is frequently used. An electronic device is further provided according to the present application, which uses the flexible device and has the effects of a smooth bending, and a long service life.

For achieving the above objects, the following technical solutions are provided according to the present application.

A flexible device includes:
a first sliding shaft;
a second sliding shaft;
a middle sliding shaft group including multiple middle sliding shafts; and
a connecting member group configured to movably connect the middle sliding shaft group to the first sliding shaft and the second sliding shaft;
the flexible device can be bent along an extending direction of the middle sliding shaft group, and a bent portion of the flexible device is always of an arc-shaped structure.

Preferably, in the flexible device, the bent portion includes M sliding shafts, and the arc-shaped structure of the bent portion refers to that an external tangent surface of the M sliding shafts is an arc-shaped surface.

Preferably, in the flexible device, in the case that the M sliding shafts form an arc-shaped structure, the sliding shafts at a first side of each of the M sliding shafts are stationary with respect to each other, and the sliding shafts at a second side of each of the M sliding shafts are stationary with respect to each other.

Preferably, in the flexible device, two ends of the connecting member group are respectively sleeved on the first sliding shaft and the second sliding shaft, and a middle portion of the connecting member group is sleeved on the middle sliding shaft group.

Preferably, in the flexible device, the connecting member group includes:

a first connecting member having five mounting holes distributed along the direction of a first straight line, wherein the mounting hole in the middle is a first mounting hole, the four mounting holes at two sides are each a second mounting hole; the first mounting hole enables a sliding shaft in cooperation with the first mounting hole to rotate about an axis of the sliding shaft, and enables the sliding shaft to slide along a direction perpendicular to the direction of the first straight line; the second mounting hole enables a sliding shaft in cooperation with the second mounting hole to rotate about an axis of the sliding shaft, and a second connecting member having five mounting holes distributed along the direction of a second straight line, wherein the mounting hole in the middle is a third mounting hole, and two mounting holes immediately adjacent to the third mounting hole are each a fourth mounting hole, and the two mounting holes at two ends are each a fifth mounting hole; the third mounting hole enables a sliding shaft in cooperation with the third mounting hole to rotate about an axis of the sliding shaft, and enables the sliding shaft to slide along a direction perpendicular to the direction of the second straight line; the fourth mounting hole enables a sliding shaft in cooperation with the fourth mounting hole to rotate about an axis of the sliding shaft, and enables the sliding shaft to slide along the extending direction of the second straight line; the fifth mounting hole enables a sliding shaft in cooperation with the fifth mounting hole to rotate about an axis of the sliding shaft; and the first connecting members are connected end-to-end in order along an arrangement direction of the middle sliding shaft group, and form a first connecting member group; the second connecting members are connected end-to-end in series along the arrangement direction of the middle sliding shaft group, and form a second connecting member group; the first mounting hole and the corresponding fifth mounting hole are sleeved the same sliding shaft.

Preferably, in the flexible device, the number of the first connecting members in the first connecting member group is at least five, and the number of the second connecting members in the second connecting member group is at least four.

Preferably, the flexible device is configured to be bendable towards only one side, one edge of the first mounting hole extends beyond one side of the first straight line, and another edge of the first mounting hole is leveled with an edge portion of the second mounting hole; one edge of the third mounting hole extends beyond one side of the second straight line, and the other edge of the third mounting hole is leveled with an edge portion of the fourth mounting hole and an edge portion of the fifth mounting hole; and extending edges of the first mounting hole and the third mounting hole are towards the same side of the flexible device.

Preferably, the flexible device is configured to be bendable along two sides; two edges of the first mounting hole respectively extend beyond two sides of the first straight line; and two edges of the third mounting hole respectively extend beyond two sides of the second straight line.

Preferably, the flexible device is configured to be capable of being maintained in any bent state.

Preferably, in the flexible device, the connecting member group has third connecting members and fourth connecting members; the third connecting members have the same structure and arrangement as the first connecting members of the connecting member group, and each of the third connecting members and the corresponding first connecting member are sleeved on the same sliding shaft; the fourth connecting members have the same structure and arrangement as the second connecting members of the connecting member group, and each of the fourth connecting members and the corresponding second connecting member are sleeved on the same sliding shaft; the two second mounting holes at two ends of the third connecting member are able to provide a rotation damping to the sliding shafts corresponding to the two second mounting holes respectively; and the fifth mounting holes of the fourth connecting member are able to provide a rotation damping to the sliding shafts corresponding to the fifth mounting holes.

Preferably, the flexible device further includes a filling block, the filling block is sleeved on the sliding shaft, and is located between two connecting members spaced apart from each other in a connecting member group formed by the same kind of connecting members connected end-to-end.

An electronic device, the second mounting holes located at two ends of the first connecting member in the connecting member group are able to provide a rotation damping to sliding shafts in cooperation with the second mounting holes respectively; and the fifth mounting holes of the second connecting member in the connecting member group are able to provide a rotation damping to the sliding shafts in cooperation with the fifth mounting holes respectively.

Preferably, one side of the flexible device is flat when the flexible device is unbent.

An electronic device includes a flexible screen and a flexible device configured to support the flexible screen, and the flexible device is the flexible device according to any one of the above technical solutions.

A flexible device is provided according to the present application, which includes a first sliding shaft, a second sliding shaft, a middle sliding shaft group and a connecting member group. The middle sliding shaft group includes multiple middle sliding shafts arranged in rows. The connecting member group movably connects the middle sliding shaft group to the first sliding shaft and the second sliding shaft. The flexible device is bendable along an extending direction of the middle sliding shaft group, and a bent portion of the flexible device always has an arc-shaped structure.

The flexible device according to the present application adopts a mechanical structure to achieve a bending deformation, thus compared with the plastic plate, can avoid the problems of a degraded bending performance and breakage generated after the flexible device is frequently used.

An electronic device is further provided according to the present application, which uses the flexible device described above, and has the effects of a smooth bending and a long service life, of the flexible device.

BRIEF DESCRIPTION OF THE DRAWINGS

For more clearly illustrating embodiments of the present application or the technical solutions in the conventional technology, drawings referred to describe the embodiments or the conventional technology will be briefly described hereinafter. Apparently, the drawings in the following description are only examples of the present application, and for the person skilled in the art, other drawings may be obtained based on the drawings without any creative efforts.

Figure 1:
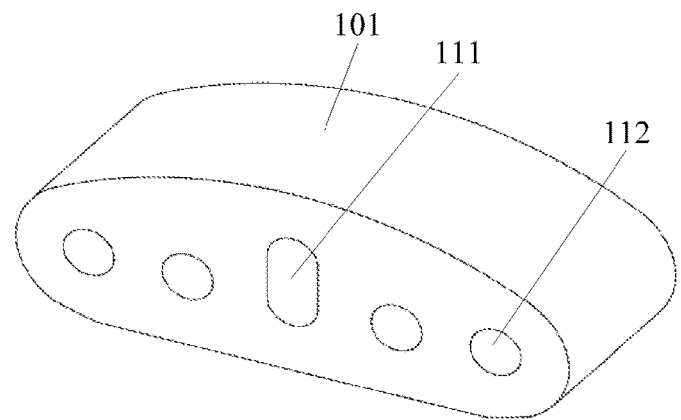
FIG. 1 is a schematic view showing the structure of a first connecting member according to an embodiment of the present application.
Figure 2:
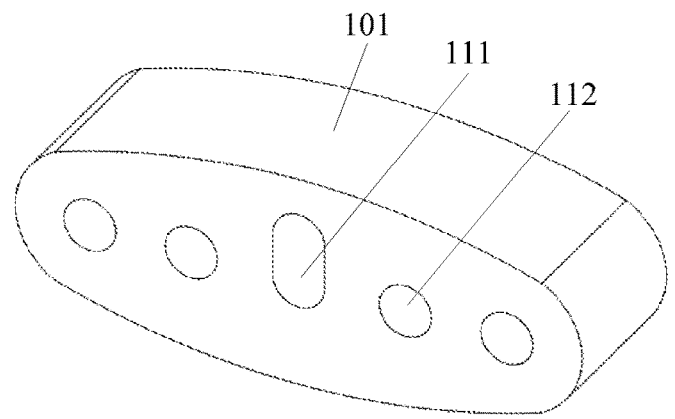
FIG. 2 is a schematic view showing another structure of the first connecting member according to an embodiment of the present application.
Figure 3:
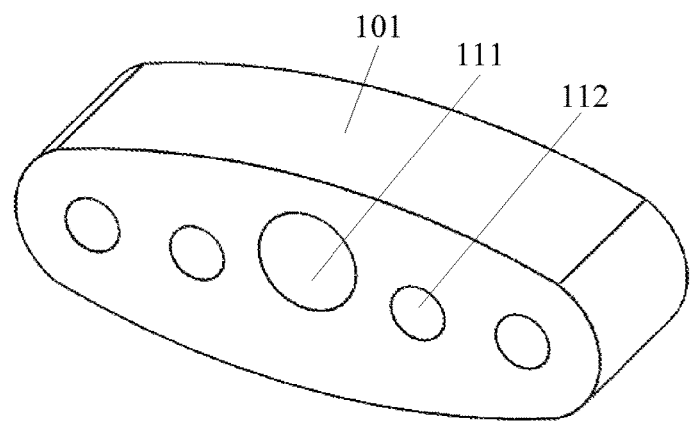
FIG. 3 is a schematic view showing yet another structure of the first connecting member according to an embodiment of the present application.
Figure 4:
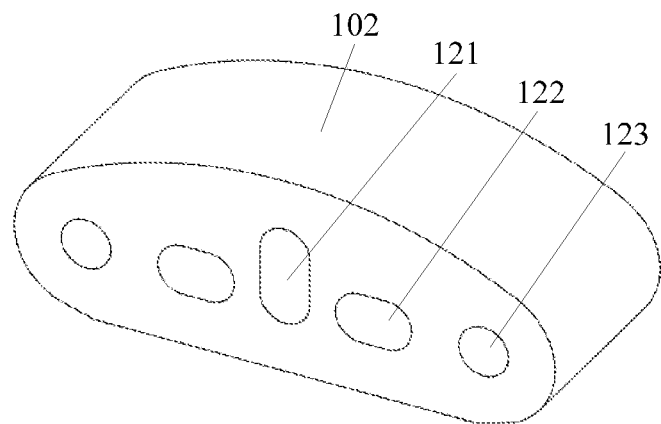
FIG. 4 is a schematic view showing the structure of a second connecting member according to an embodiment of the present application.

Reference numerals in FIGS. 1 to 46:

| | |
|---|---|
| 101 first connecting member, | 111 first mounting hole, |
| 112 second mounting hole, | 1011 first member portion, |
| 1012 second member portion, | 102 second connecting member, |
| 121 third mounting hole, | 122 fourth mounting hole, |
| 121 fifth mounting hole, | 1021 third member portion, |
| 1022 fourth member portion, | 103 third connecting member, |
| 104 fourth connecting member, | 200 filling block, |
| 301 first sliding shaft, | 302 second sliding shaft, |
| 303 middle sliding shaft, | 401 socket portion, |
| 402 mounting handle, and | 500 second fixed connection piece. |

DETAILED DESCRIPTION

A flexible device is provided according to the present application, which adopts a mechanical structure to realize bending deformation, and, compared with a plastic plate, can avoid the problems of a degraded bending performance and breakage generated after the flexible device is used frequently. An electronic device is further provided according to the present application, which employs the flexible device, and has the effects of a smooth bending, and a long service life.

Technical solutions of the embodiments according to the present application will be described hereinafter clearly and completely in conjunction with the accompanying drawings in the embodiments according to the present application. Apparently, the embodiments are only a portion of the embodiments according to the present application, rather than all of the embodiments. All other embodiments obtained, based on the embodiments according to the present application, by those skilled in the art without any creative work should be deemed to fall into the protection scope of the present application.

Referring to FIGS. 1 to 46, a flexible device is provided according to an embodiment of the present application, which includes a first sliding shaft 301, a second sliding shaft 302, a middle sliding shaft group, and a connecting member group. The middle sliding shaft group includes multiple middle sliding shafts 303 arranged in rows. Axes of the first sliding shaft 301, the second sliding shaft 302, and the middle sliding shafts 303 are parallel to each other, and the first sliding shaft 301 and the second sliding shaft 302 are located at two sides of the middle sliding shaft group. The middle sliding shaft group is movably connected to the first sliding shaft 301 and the second sliding shaft 302 by the connecting member group. The flexible device can be bent along an extending direction of the middle sliding shaft group, and a bent portion of the flexible device is always of an arc-shaped structure.

The flexible device according to the present application adopts a mechanical structure to realize the bending deformation, thus compared with the plastic plate in the conventional technology, can avoid the problems of the degraded bending performance and breakage generated after the flexible device is frequently used.

In the above flexible device, the bent portion includes M sliding shafts, and the bent portion being of the arc-shaped structure refers to that an external tangent surface of the M sliding shafts is an arc-shaped surface.

Further, in the above flexible device, in the case that the M sliding shafts form the arc-shaped structure, the sliding shafts at a first side of each of the M sliding shafts are stationary with respect to each other, and the sliding shafts at a second side of each of the M sliding shafts are stationary with respect to each other. In the flexible device, the sliding shafts at two sides of each of the M sliding shafts are respectively stationary in the process of the M sliding shafts forming the arc-shaped structure, namely, portions at two sides of the bent portion of the flexible device are not deformed in the process of the M sliding shafts forming the arc-shaped structure, thus it is convenient for users to bend the flexible device according to practical requirements. Of course, the M sliding shafts may be configured to include the first sliding shaft 301 and part of the middle sliding shaft group or to include the second sliding shaft 302 and part of the middle sliding shaft group. Or the M sliding shafts may be configured to include the first sliding shaft 301, the second sliding shaft 302 and the middle sliding shaft group, and correspondingly, the flexible device may form a C-type arc-shaped structure, and may further be rolled into a roll shape, which is convenient for the users to store.

Specifically, in the above flexible device, two ends of the connecting member group are respectively sleeved on the first sliding shaft 301 and the second sliding shaft 302, and a middle portion of the connecting member group is sleeved on the middle sliding shaft group.

The above connecting member group may be configured to include double shaft toothed blocks each being sleeved on the sliding shafts, the sliding shafts are connected as a whole by the double shaft toothed blocks, and the double shaft toothed blocks that are adjacent are meshed to form an interference connection, thus allowing the M sliding shafts in the flexible device to form the arc-shaped structure. For simplifying the structure and facilitating the assembly, the above connecting structure is preferably configured to include a first connecting member 101, and a second connecting member 102.

The first connecting member 101 has five mounting holes distributed along the direction of a first straight line, specifically, the mounting hole in the middle is a first mounting hole 111, and the mounting holes at two sides each are a second mounting hole 112. The first mounting hole 111 enables a sliding shaft in cooperation with the first mounting hole 111 to rotate about an axis of the sliding shaft, and enables the sliding shaft to slide along a direction perpendicular to the direction of the first straight line. The second mounting hole 112 enables a sliding shaft in cooperation with the second mounting hole 112 to rotate about an axis of the sliding shaft.

The second connecting member 102 has five mounting holes distributed along the direction of a second straight line, specifically, the mounting hole in the middle is a third mounting hole 121, and two mounting holes directly adjacent to the third mounting hole 121 each are a fourth mounting hole 122, and two mounting holes at two ends each are a fifth mounting hole 123. The third mounting hole 121 enables a sliding shaft in cooperation with the third mounting hole 121 to rotate about an axis of the sliding shaft, and enables the sliding shaft to slide along a direction perpendicular to the direction of the second straight line. The fourth mounting hole 122 enables a sliding shaft in cooperation with the fourth mounting hole to rotate about an axis of the sliding shaft, and enables the sliding shaft to slide along the direction of the second straight line. The fifth mounting hole 123 enables the sliding shaft in cooperation with the fifth mounting hole 123 to rotate about an axis of the sliding shaft.

Figure 5:
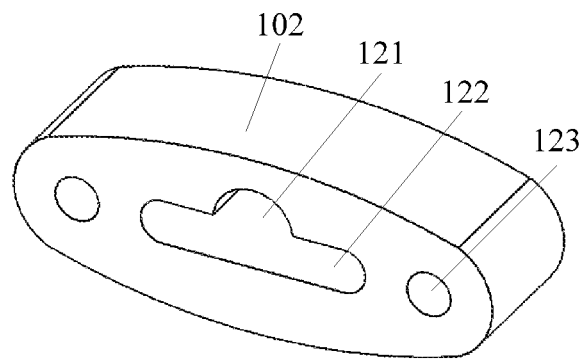
FIG. 5 is a schematic view showing another structure of the second connecting member according to an embodiment of the present application.
Figure 6:
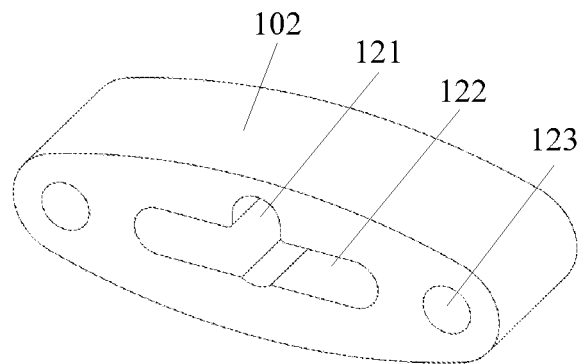
FIG. 6 is a schematic view showing another structure of a second connecting member according to an embodiment of the present application.
Figure 7:
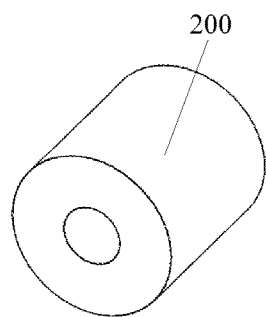
FIG. 7 is a schematic view showing the structure of a filling block according to an embodiment of the present application.
Figure 8:
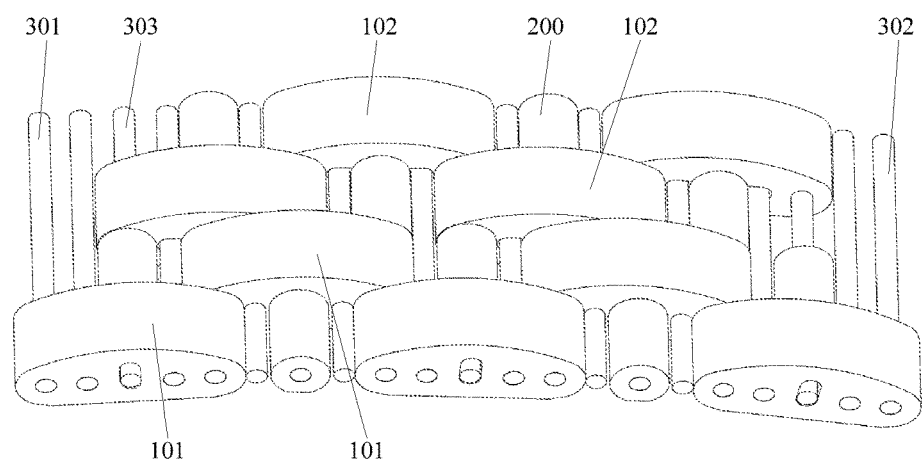
FIG. 8 is a schematic view showing the assembly of a first connecting member, a second connecting number, and a sliding shaft according to an embodiment of the present application.
Figure 9:
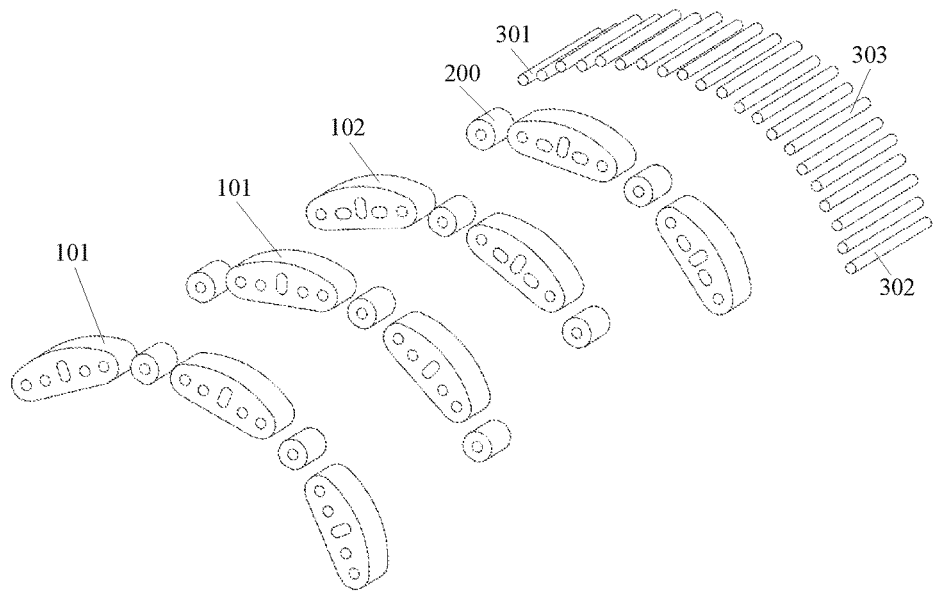
FIG. 9 is an exploded schematic view of the structure in FIG. 8.
Figure 10:
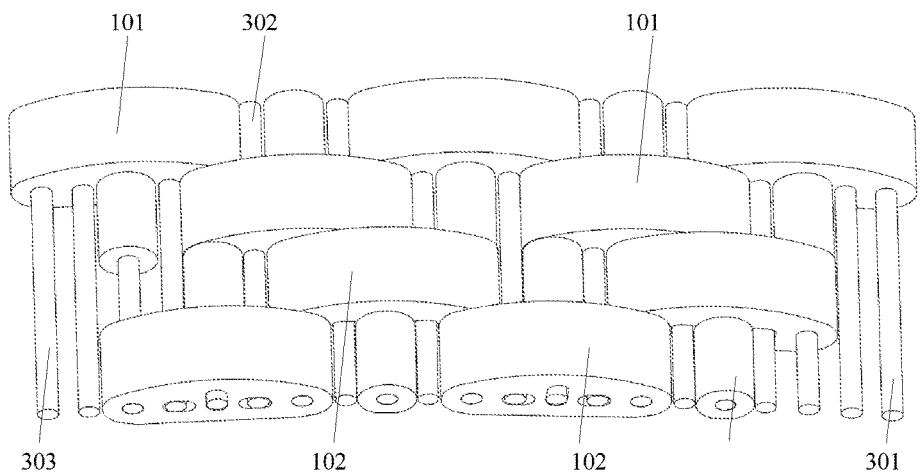
FIG. 10 is a schematic view showing the structure in FIG. 8 from another angle.
Figure 11:
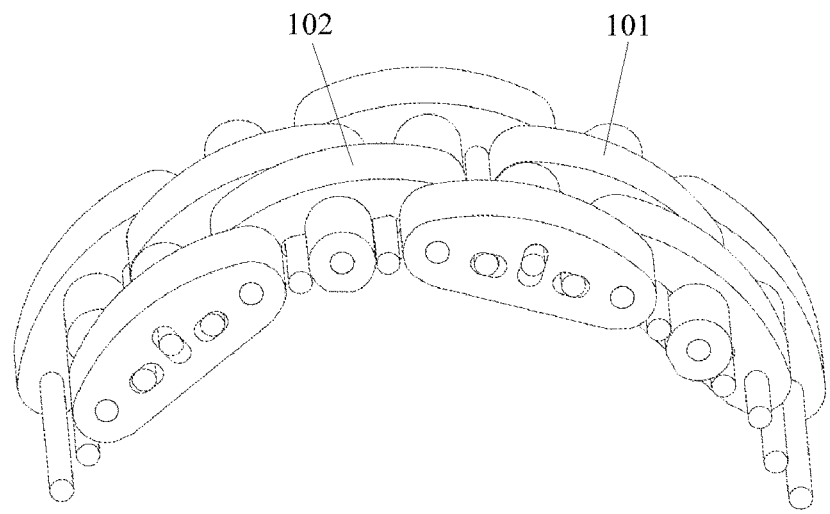
FIG. 11 is a schematic structural view of the structure in FIG. 10 in a bent state.
Figure 12:
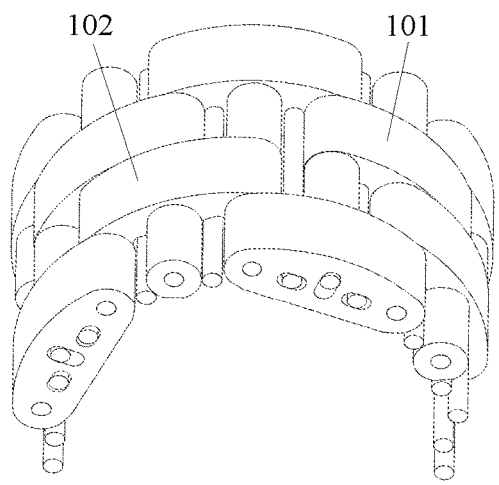
FIG. 12 is a schematic structural view of the structure in FIG. 10 at a maximum degree of bending.
Figure 13:
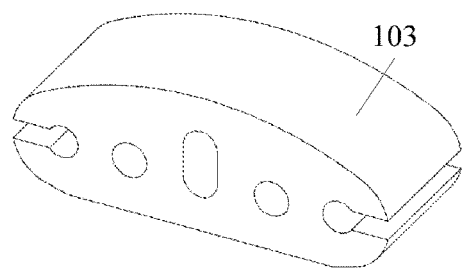
FIG. 13 is a schematic view showing the structure of a third connecting member according to an embodiment of the present application.
Figure 14:
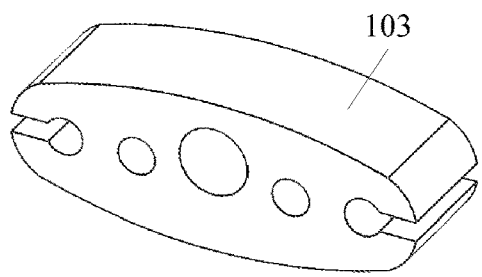
FIG. 14 is a schematic view showing another structure of the third connecting member according to an embodiment of the present application.
Figure 15:
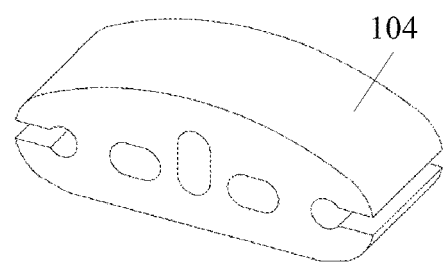
FIG. 15 is a schematic view showing the structure of a fourth connecting member according to an embodiment of the present application.
Figure 16:
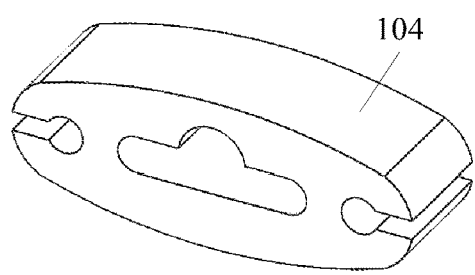
FIG. 16 is a schematic view showing another structure of the fourth connecting member according to an embodiment of the present application.
Figure 17:
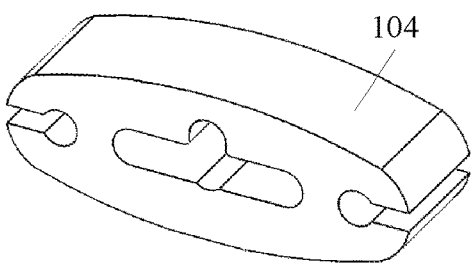
FIG. 17 is a schematic view showing yet another structure of the fourth connecting member according to an embodiment of the present application.
Figure 18:
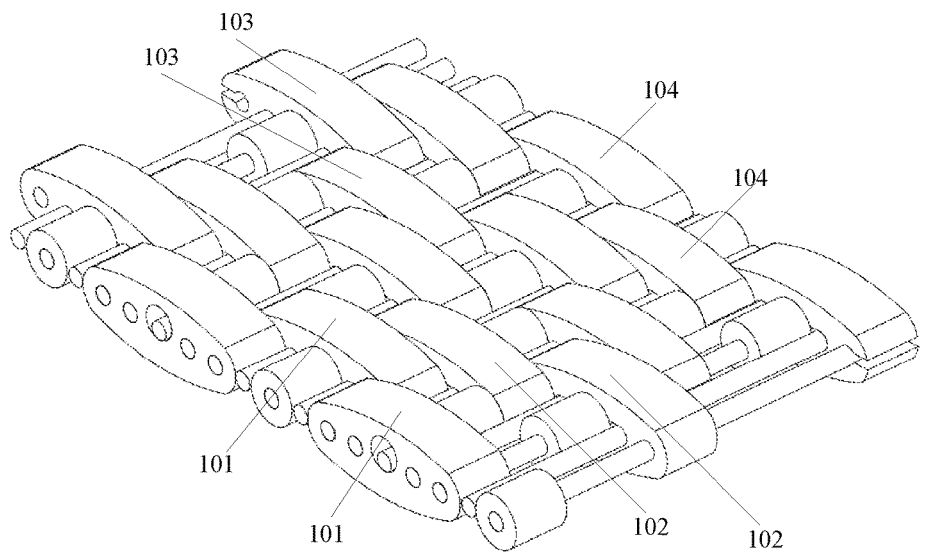
FIG. 18 is a schematic view showing the assembly of the first connecting member, the second connecting number, the third connecting member, the fourth connecting member, the filling block, and the sliding shafts according to an embodiment of the present application.
Figure 19:
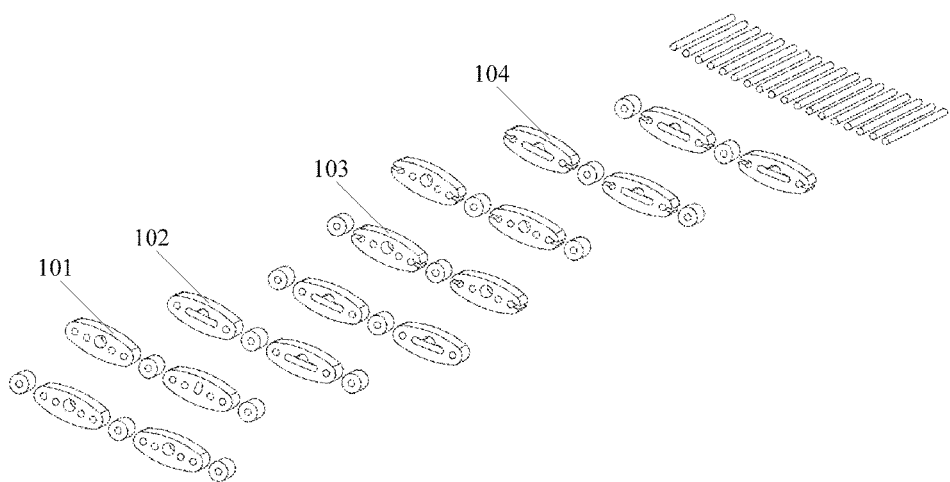
FIG. 19 is an exploded view showing the assembly of the first connecting member, the second connecting number, the third connecting member, the fourth connecting member, the filling block, and the sliding shafts according to an embodiment of the present application.
Figure 20:
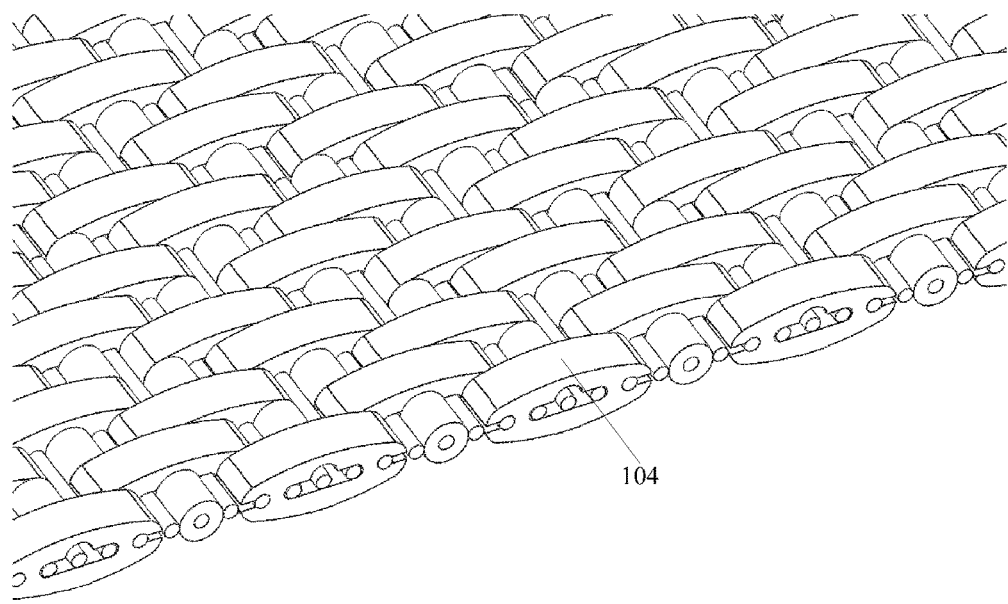
FIG. 20 is a schematic view showing the structure of a flexible device according to an embodiment of the present application.
Figure 21:
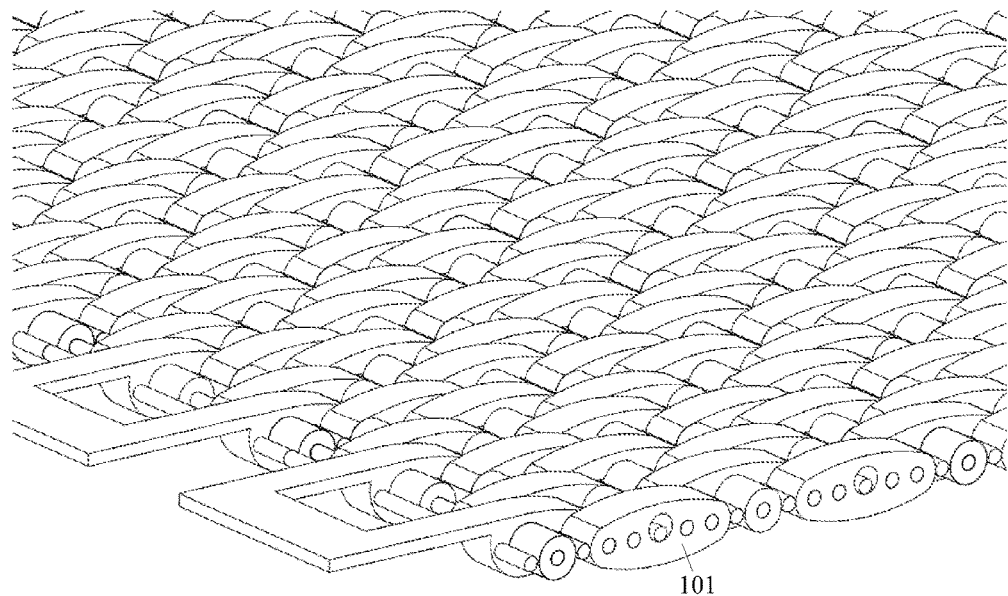
FIG. 21 is a schematic view showing the structure of the flexible device f according to the embodiment of the present application from another angle.
Figure 22:
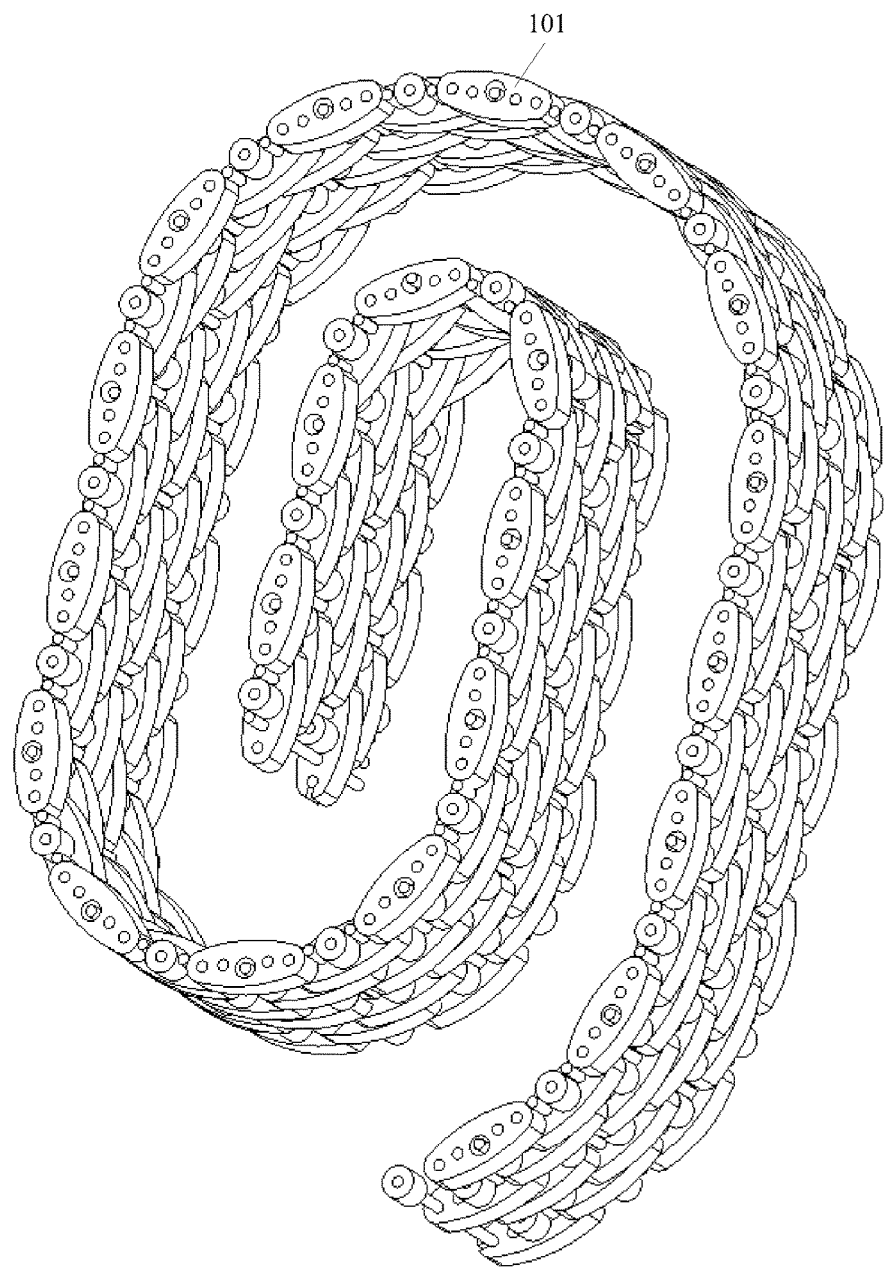
FIG. 22 is a schematic view showing the structure of the flexible device according to the embodiment of the present application in a bent state.
Figure 23:
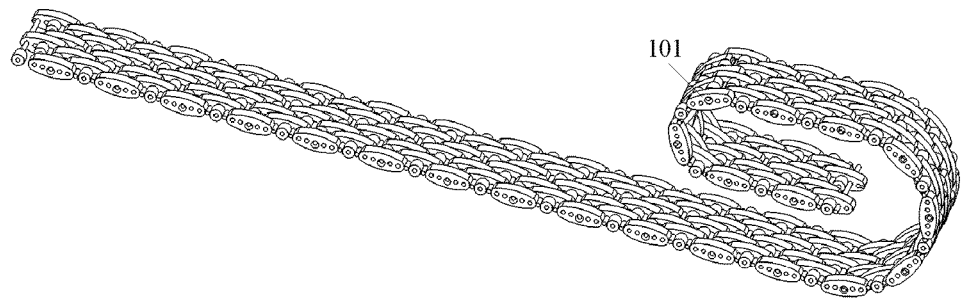
FIG. 23 is a schematic view showing the structure of the flexible device according to the embodiment of the present application in another bent state.
Figure 24:
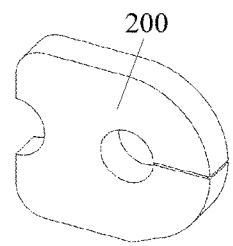
FIG. 24 is a schematic view showing the structure of a sheet-like filling block according to an embodiment of the present application.
Figure 25:
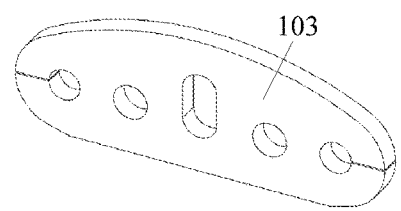
FIG. 25 is a schematic view showing the structure of a sheet-like third connecting member according to an embodiment of the present application.
Figure 26:
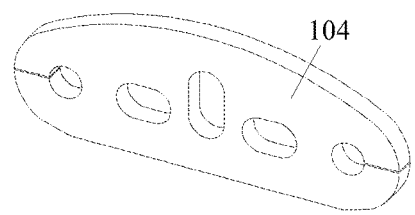
FIG. 26 is a schematic view showing the structure of a sheet-like fourth connecting member according to an embodiment of the present application.
Figure 27:
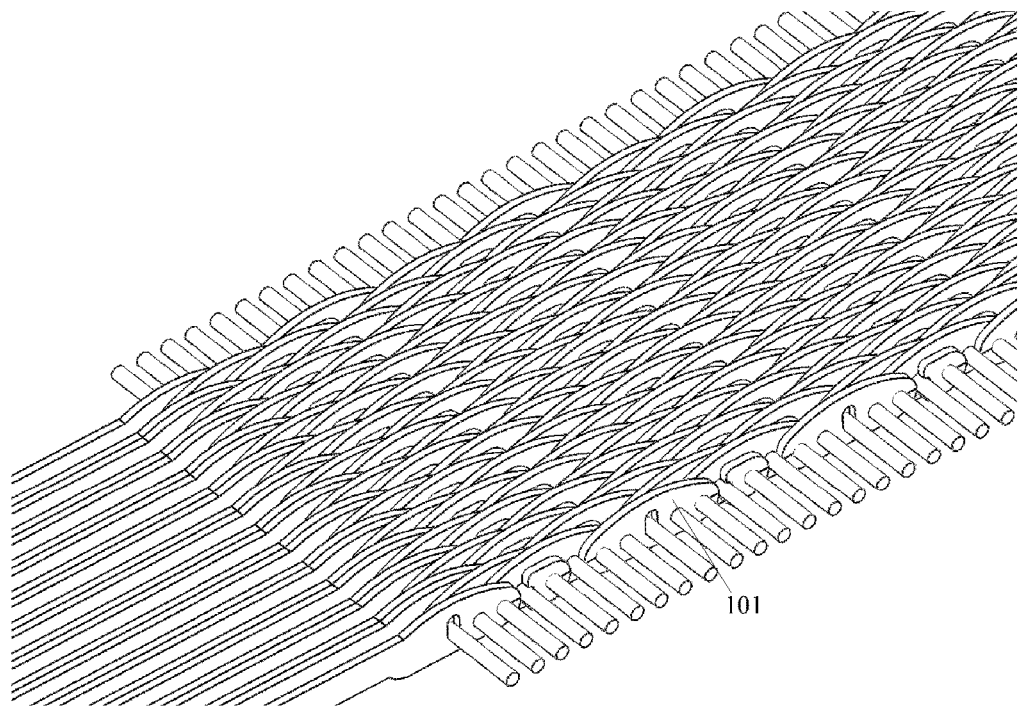
FIG. 27 is a schematic view showing the structure of a flexible device in which each of the connecting members is a sheet-like structure according to an embodiment of the present application.
Figure 28:
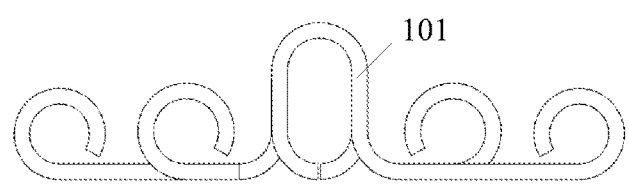
FIG. 28 is a front schematic view showing the structure of a first connecting member manufactured by stamping, cutting and curling according to an embodiment of the present application.
Figure 29:
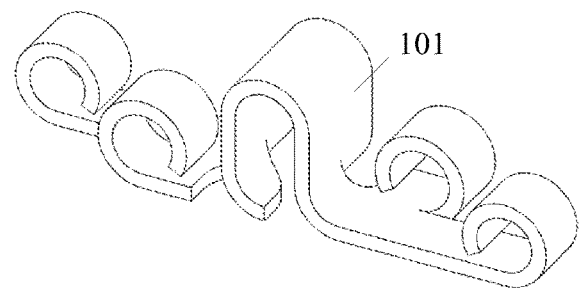
FIG. 29 is a perspective view of the structure in FIG. 28.
Figure 30:
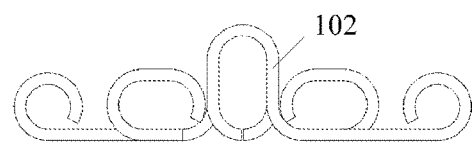
FIG. 30 is a front schematic view showing the structure of a second connecting member manufactured by stamping, cutting and curling according to an embodiment of the present application.
Figure 31:
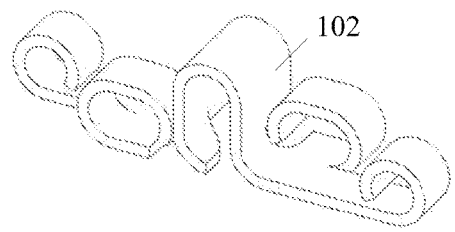
FIG. 31 is a perspective view of the structure in FIG. 30.
Figure 32:
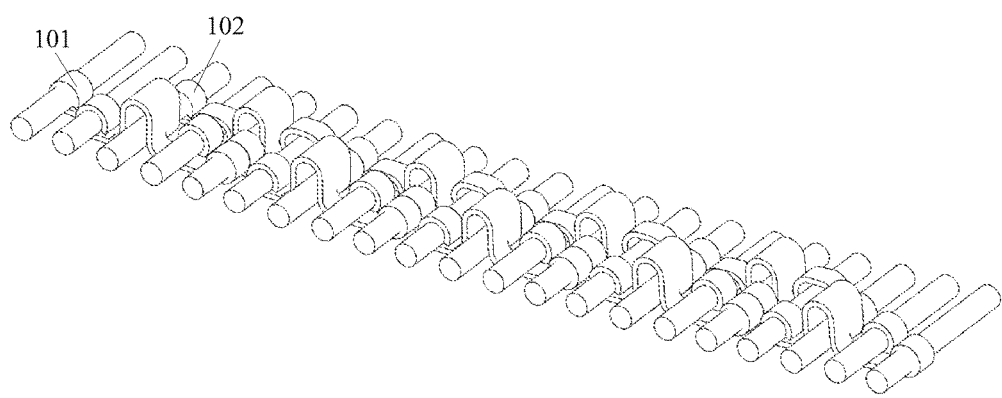
FIG. 32 is a schematic view showing the structure of a flexible device having the connecting members in FIGS. 29 and 30 according to an embodiment of the present application.
Figure 33:
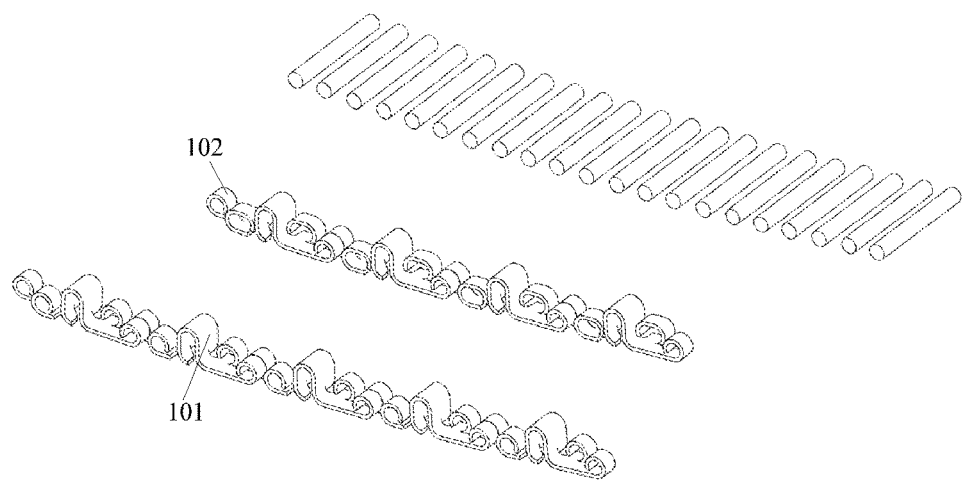
FIG. 33 is an exploded view of the structure in FIG. 22.
Figure 34:
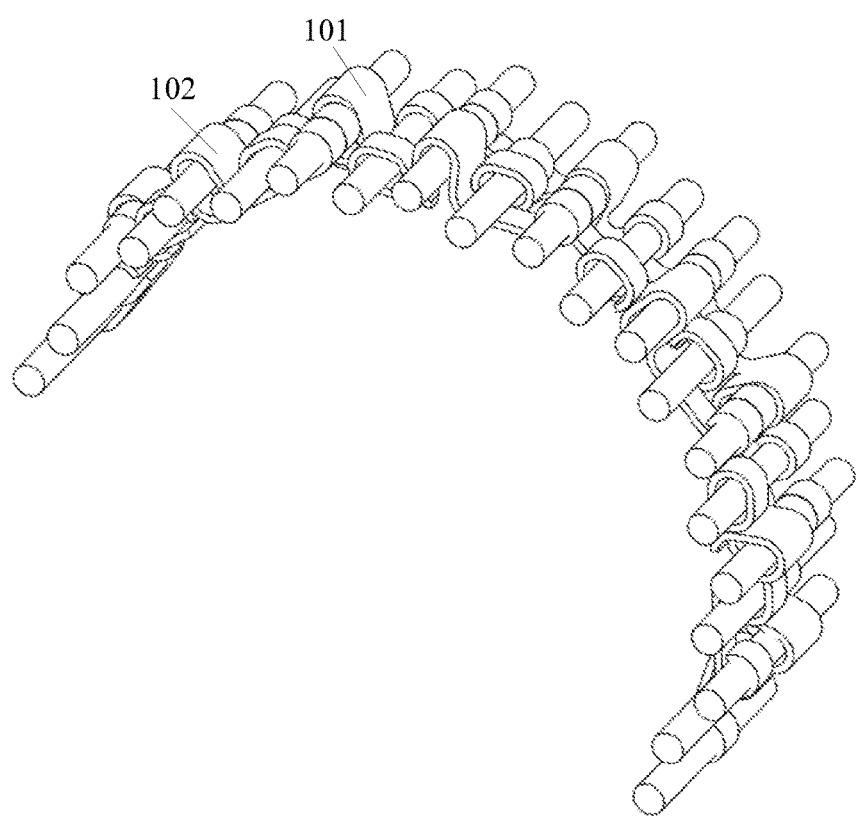
FIG. 34 is a schematic view showing the structure of the flexible device in FIG. 32 in a bent state.
Figure 35:
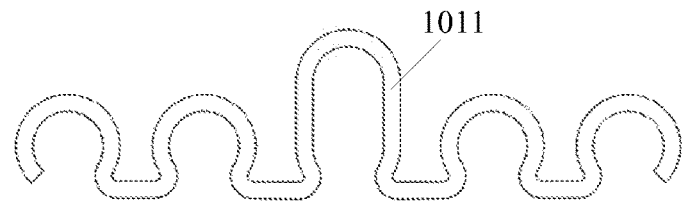
FIG. 35 is a front schematic view showing the structure of a first member portion according to an embodiment of the present application.
Figure 36:
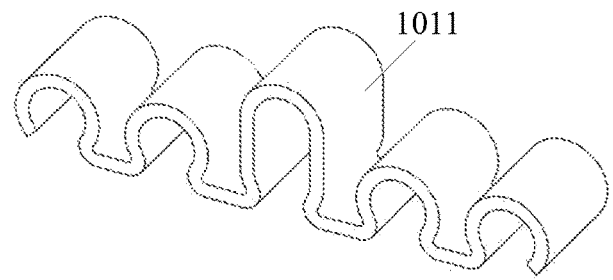
FIG. 36 is a perspective schematic view showing the structure of the first member portion in FIG. 35.
Figure 37:
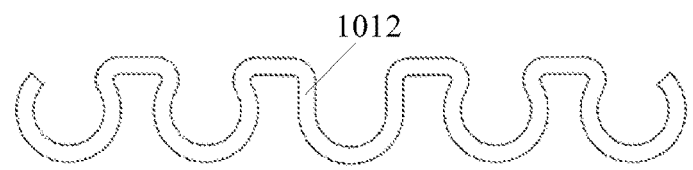
FIG. 37 is a front schematic view showing the structure of a second member portion according to an embodiment of the present application.
Figure 38:
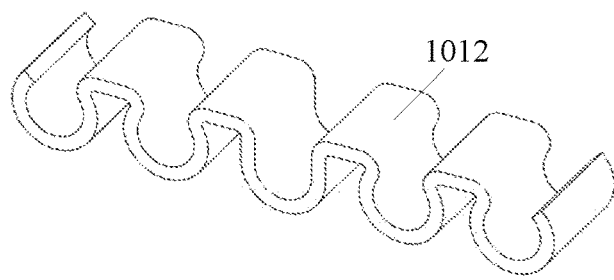
FIG. 38 is a perspective schematic view showing the structure of the second member portion shown in FIG. 37.
Figure 39:
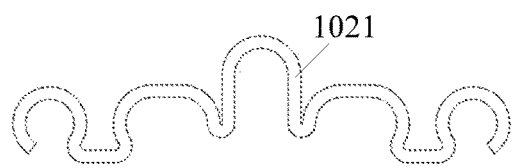
FIG. 39 is a front schematic view showing the structure of a third member portion according to an embodiment of the present application.
Figure 40:
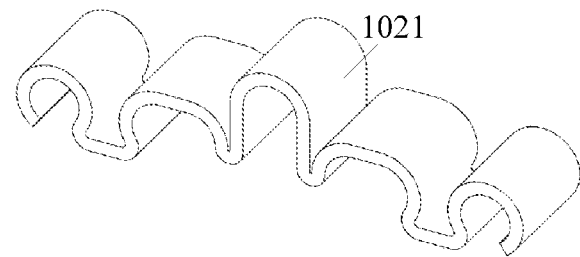
FIG. 40 is a perspective schematic view showing the structure of the third member portion in FIG. 39.
Figure 41:
FIG. 41 is a front schematic view showing the structure of a fourth member portion according to an embodiment of the present application.
Figure 42:
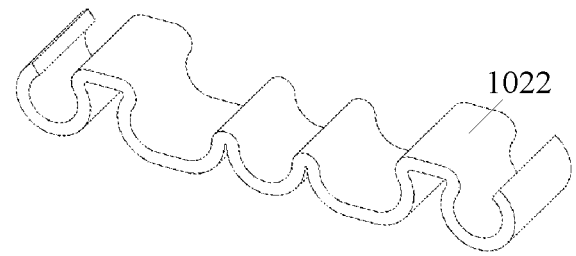
FIG. 42 is a perspective schematic view showing the structure of the fourth member portion shown in FIG. 41.
Figure 43:
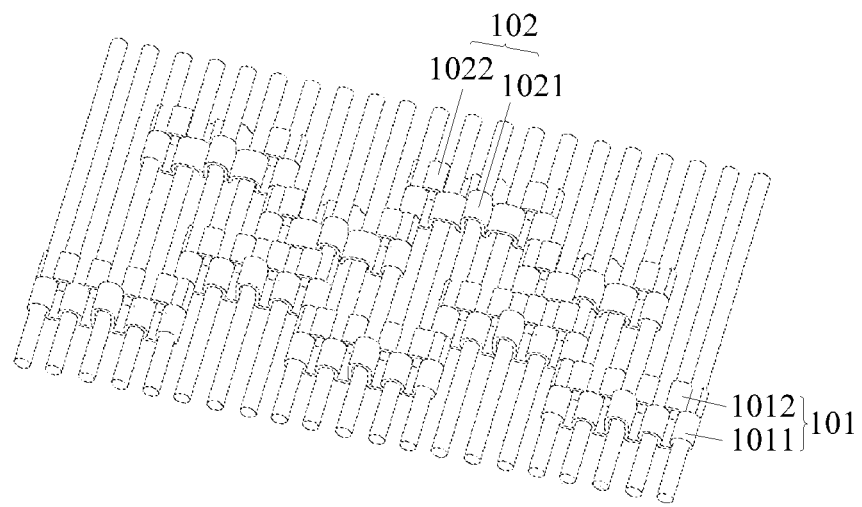
FIG. 43 is a schematic view showing the structure of a flexible device having the first member portion, the second member portion, the third member portion, and the fourth member portion according to an embodiment of the present application.
Figure 44:
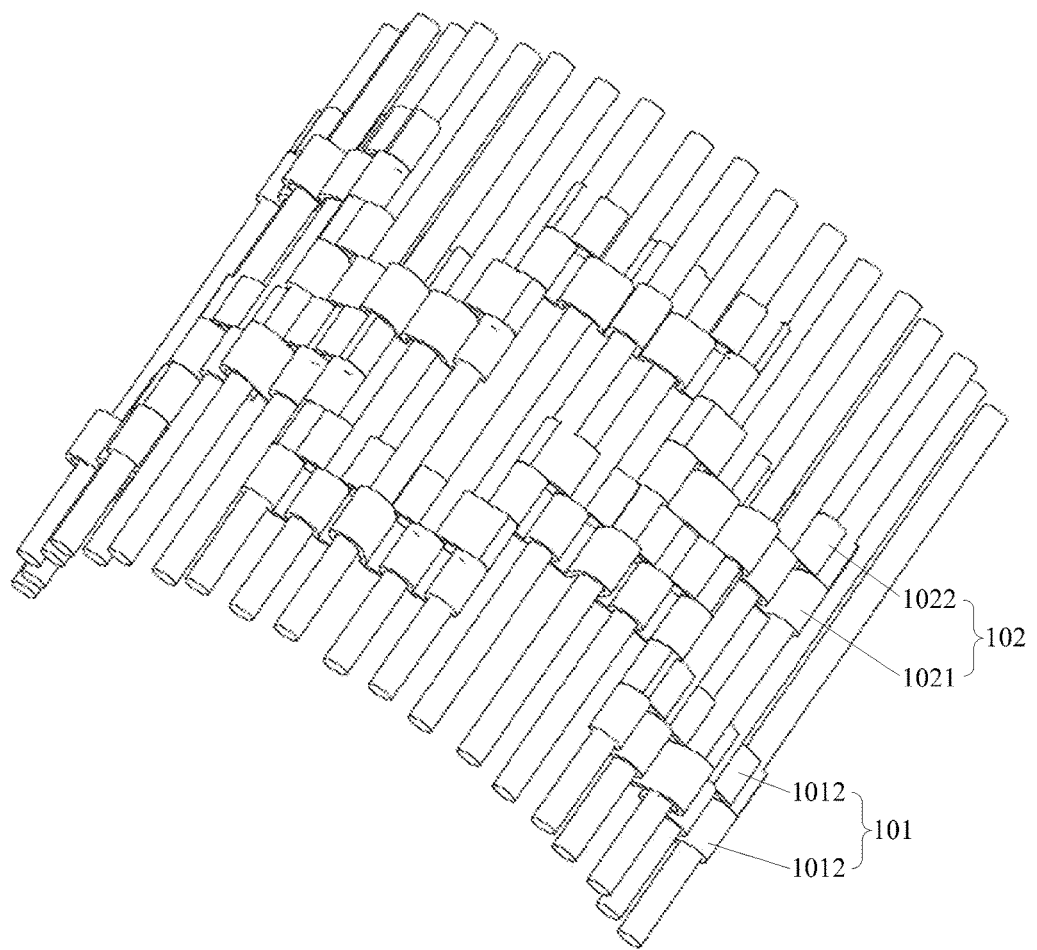
FIG. 44 is a schematic view showing the structure of the flexible device in FIG. 43 in a bent state.

The first connecting members 101 are connected end-to-end in order along an arrangement direction of the middle sliding shaft group, and form a first connecting member group. The second connecting members 102 are connected end-to-end in order along an arrangement direction of the middle sliding shaft group, and form a second connecting member group. The first mounting hole 111 and the corresponding fifth mounting hole 123 are sleeved on a same sliding shaft. Being connected end-to-end as described above means that the mounting holes at ends of two adjacent connecting members are sleeved on a same sliding shaft, thus the first connecting member group and the second connecting member group each having connecting members staggered are respectively formed. Of course, for facilitating manufacturing, the third mounting hole 121 and two fourth mounting holes 122 may be arranged to communicate with each other, as shown in FIGS. 5 and 6.

In the flexible device according to this embodiment, two kinds of connecting members are respectively sleeved on the sliding shafts, which allows the M sliding shafts to form the arc-shaped structure by movements of the sliding shafts in the mounting holes and slight deformations of the sliding shafts during the using process, thus the structure thereof is simple and the assembly is facilitated. In practical use, by reasonably designing a size of each of the mounting holes, the external tangent surface of the above M sliding shafts is allowed to be deformed as a circular-arc-shaped surface, thus, in one aspect, can meet use requirements of the users, and in another aspect, facilitates reducing of a volume of the flexible device in the case that the flexible device is folded into an u-shaped structure or a snake-shaped structure, thereby providing convenience for the users in storing the flexible device.

In the flexible device according to the above embodiment, the number of the first connecting members 101 in the first connecting member group is at least five, and the number of the second connecting members 102 in the second connecting member group is at least four, thus ensuring that the flexible device can be bent, and the bent portion is always of an arc shape in the bent process.

The above flexible device may be configured to be bendable along only one side. Correspondingly, one edge of the first mounting hole 111 extends beyond one side of the first straight line, and another edge of the first mounting hole 111 is leveled with an edge portion of the second mounting hole 112; and one edge of the third mounting hole 121 extends beyond one side of the second straight line, and another edge of the third mounting hole 121 is leveled with an edge portion of the fourth mounting hole 122 and an edge portion of the fifth mounting hole 123. Also, extending directions of the first mounting hole 111 and the third mounting hole 121 are toward a same side of the flexible device. The flexible device according to this embodiment can only be bent from a straight state toward one side of the flexible device, thus can prevent a device supported by the flexible device, such as a flexible screen, from being reversely bent and prevent the device such as the above flexible screen from being damaged.

Of course, the flexible device may further be configured to be bendable towards two sides according to practical requirements, and correspondingly, two edges of the first mounting hole 111 respectively extend beyond two sides of the first straight line, and two edge portions of the third mounting hole 121 respectively extends beyond two sides of the second straight line. A bending direction of the flexible device is not limited in this embodiment, and the bending direction may be set only by adjusting the extending directions of the first mounting hole 111 and the third mounting hole 121 according to practical requirements. In addition, a bending degree of the flexible device may be adjusted by adjusting lengths of the first mounting hole 111 and the third mounting hole 121 according to practical requirements.

Since an object supported by the flexible device (for example the flexible screen) is usually required to keep in a fixed state during use, the flexible device according to the above embodiment is preferably configured to be able to keep in any bent state.

Specifically, the above flexible device may be kept in any bent state through an additional member as provided, for example, the connecting member group is configured to further include a third connecting member 103 and a fourth connecting member 104. The third connecting members 103 have the same structure and arrangement way as the first connecting members 101, and each of the third connecting members 103 and the corresponding first connecting member 101 are sleeved on a same sliding shaft. The fourth connecting members 104 have the same structure and arrangement as the second connecting members 102, and each of the fourth connecting members 104 and the corresponding second connecting member 102 are sleeved on the same sliding shaft. The two second mounting holes 112 located at two ends of each of the third connecting members 103 can provide a rotation damping to the sliding shafts corresponding to the two second mounting holes 112 respectively. The fifth mounting holes 123 of each of the fourth connecting members 104 can provide a rotation damping to the sliding shafts corresponding to the fifth mounting holes 123 respectively. The two second mounting holes 112 located at two ends of each of the third connecting members 103, and the fifth mounting holes 123 of each of the fourth connecting members 104 can be respectively configured as a hole with opening, which not only facilitates the assembly with the mounting holes, but also may allow the above two kinds of mounting holes to provide the rotation damping to the corresponding sliding shafts through an interference fit.

Of course, for reducing the number of the connecting members and simplifying assembly and operation, the flexible device according to the above embodiment may be further configured in such a way that the second mounting holes 112 located at two ends of the first connecting member and the fifth mounting holes 123 of the second connecting member are each configured as a mounting hole capable of providing a rotation damping to the corresponding sliding shaft, to enable the flexible device to keep in any bent state. Specifically, a friction pad for closely cooperating with the sliding shaft, such as a rubber pad, may be fixed in the mounting hole.

In the above flexible device, the connecting members in the connecting member group are all staggered, thus, there are many clearances, which are apt to cause damage to the device supported by the flexible device in the case that an external force is applied to the device. Therefore, the flexible device according to the above embodiment further includes a filling block 200, and the filling block 200 is sleeved on the sliding shaft, and is located between two connecting members spaced apart from each other in the connecting member group. Three sliding shafts are arranged between the two connecting members spaced apart from each other in the above connecting member group, and for avoiding an interference in relative movements of the three sliding shafts, the above filling block 200 is only sleeved on one of the three sliding shafts. Of course, any two of the three sliding shafts may be each provided with the filling block 20, or the three sliding shafts may be each provided with the filling block 200.

Preferably, one side of the flexible device according to the above embodiment is flat when the flexible device is unbent, which facilitates the arrangement of the flexible screen. The flexible device may adopt the first connecting member 101 in FIG. 1, the second connecting member 102 in FIG. 4, the third connecting member 103 in FIG. 13, and the fourth connecting member 104 in FIG. 15.

In the above flexible device, the first connecting member 101 and the second connecting member 102 may be respectively configured to have a block-like structure, as shown in FIGS. 1-6, and correspondingly, the third connecting member 103, the fourth connecting member 104, and the filling block 200 may have structures respectively shown in FIGS. 7, 13 to 17. The first connecting member 10 and the second connecting member 102 may further be each configured to be of a sheet-like structure which can be conveniently manufactured by stamping, and correspondingly, the third connecting member 103, the fourth connecting member 104, and the filling block 200 are of the structures which can be conveniently manufactured by stamping shown in FIGS. 24, 25, and 26 respectively.

For reducing a size of the flexible device, the above first connecting member 101 and the second connecting member 102 may further be configured to be of the structures in FIGS. 28 to 31 respectively, and the first connecting member 101 and the second connecting member 102 are respectively manufactured with a steel sheet by stamping, bending and curling, to allow the mounting holes to be encircled by curled edges, and allow the curled edges of the second mounting holes 112 located at two ends of the first connecting member 101 and the fifth mounting holes 123 of the second connecting member 102 to tightly hold the sliding shafts to provide the rotation damping to the sliding shafts.

Further, for omitting the curling procedure, and facilitating production and manufacturing, the first connecting member 101 in the above flexible device may be further configured to include a first member portion 1011 and a second member portion 1012, and the two member portions are respectively sleeved on a same sliding shaft and form the first mounting hole 111 and the second mounting hole 112 together, as shown in FIGS. 35 to 38 and FIGS. 43 to 44. Correspondingly, the second connecting member 102 is configured to include a third member portion 1021 and a fourth member portion 1022, and the two member portions are respectively sleeved on a same sliding shaft and form the third mounting hole 121, the fourth mounting hole 122 and the fifth mounting holes 123 together, as shown in FIGS. 39 to 44. The flexible device according to this embodiment can be manufactured to have an overall thickness of only 1.2 millimeters.

Figure 45:
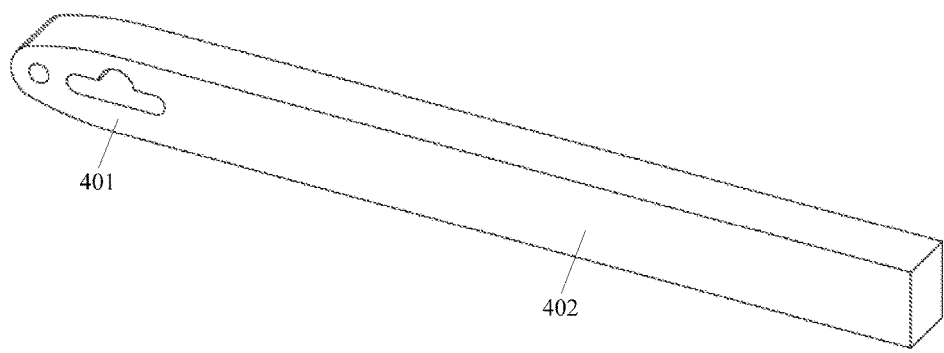
FIG. 45 is a schematic view showing the structure of a first fixed connection member according to an embodiment of the present application.
Figure 46:
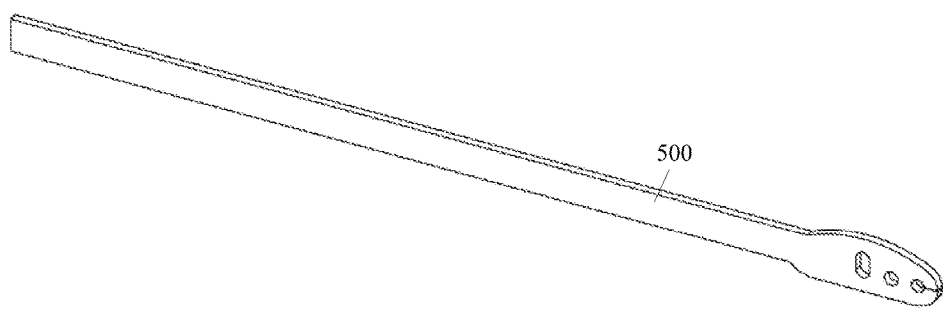
FIG. 46 is a schematic view showing the structure of a second fixed connection member according to an embodiment of the present application.

The above flexible device further includes a first fixed connection member configured to be fixedly connected to a frame of the electronic device, as shown in FIG. 45. The first fixed connection member includes a mounting handle 402 and a mounting portion 401 fixedly connected to the mounting handle. The mounting portion 401 is provided with mounting holes, and the mounting portion is configured to be sleeved on the first sliding shaft 301 and the middle sliding shaft 303 adjacent to the first sliding shaft 301, or is configured to be sleeved on the second sliding shaft 302 and the middle sliding shaft 303 adjacent to the second sliding shaft. According to the practical arrangement of the first connecting members 101 and the second connecting members 102, the above mounting holes may be configured to be the same as the mounting holes in the first connecting member 101; or the same as the mounting holes in the second connecting member 102. Or the above mounting holes may also be configured to only include three mounting holes, and the three mounting holes are respectively the same as the first mounting hole 111 and the two second mounting holes 112 located at the same side of the first mounting hole; or the three mounting holes are respectively the same as the third mounting hole 121 and the fourth mounting hole 122 and the fifth mounting hole 123 located at the same side of the third mounting hole 121. The number and structure of the mounting holes in the mounting portion are not limited in this embodiment; however, it should be ensured that the flexible device can be normally deformed when the mounting portion is sleeved on the sliding shafts.

Further, the above flexible device further includes a second fixed connection member 500, and the second fixed connection member has the same structure as the first fixed connection member, and a mounting hole at an end of a mounting portion of the second fixed connection member is a hole with opening, which is configured to be in an interference fit with the sliding shaft corresponding to mounting hole.

An electronic device is further provided according to the present application, which has a flexible screen and a flexible device for supporting the flexible screen, and the flexible device is the flexible device according to the above embodiments.

The electronic device according to this embodiment employs the flexible device according to the above embodiments, thus may ensure a smooth bending deformation of the flexible screen, and a long service life. Of course, the electronic device according to this embodiment further has other effects of the flexible device according to the above embodiments, which are not described in detail hereinafter.

The above embodiments are described in a progressive manner. Each of the embodiments is mainly focused on describing its differences from other embodiments, and references may be made among these embodiments with respect to the same or similar portions among these embodiments.

Based on the above description of the disclosed embodiments, the person skilled in the art may carry out or use the present application. It is apparent for those skilled in the art to make many modifications to the embodiments. The general principle defined herein may be applied to other embodiments without departing from the spirit or scope of the present application. Therefore, the present application is not limited to the embodiments illustrated herein, but should be defined by the broadest scope consistent with the principle and novel features disclosed herein.

What is claimed is:

1. A flexible device, comprising:
   a first sliding shaft;
   a second sliding shaft;
   a middle sliding shaft group, comprising a plurality of middle sliding shafts; and
   a connecting member group, the middle sliding shaft group being movably connected to the first sliding shaft and the second sliding shaft by the connecting member group;
   wherein the flexible device is bendable along an extending direction of the middle sliding shaft group, and a bent portion formed after bending the flexible device is of an arc-shaped structure;
   wherein the bent portion comprises M sliding shafts, and an external tangent surface of the M sliding shafts is an arc-shaped surface;
   wherein in the case that the M sliding shafts forms the arc-shaped structure, sliding shafts at a first side of each of the M sliding shafts are stationary with respect to each other, and the sliding shafts at a second side of each of the M sliding shafts are stationary with respect to each other;
   wherein two ends of the connecting member group are respectively sleeved on the first sliding shaft and the second sliding shaft, and a middle portion of the connecting member group is sleeved on the middle sliding shaft group;
   wherein the connecting member group comprises:
      a first connecting member having five mounting holes distributed in a first direction, wherein the mounting hole in the middle is a first mounting hole, four mounting holes at two sides each are a second mounting hole; the first mounting hole enables a sliding shaft in cooperation with the first mounting hole to rotate about an axis of the sliding shaft, and enables the sliding shaft to slide along a direction perpendicular to the first direction; the second mounting hole enables a sliding shaft in cooperation with the second mounting hole to rotate about an axis of the sliding shaft, and
      a second connecting member having five mounting holes distributed in a second direction, wherein the mounting hole in the middle is a third mounting hole, and two mounting holes directly adjacent to the third mounting hole are each a fourth mounting hole, and two mounting holes at two ends are each a fifth mounting hole; the third mounting hole enables a sliding shaft in cooperation with the third mounting hole to rotate about an axis of the sliding shaft, and enables the sliding shaft to slide along a direction perpendicular to the second direction; the fourth mounting hole enables a sliding shaft in cooperation with the fourth mounting hole to rotate about an axis of the sliding shaft, and enables the sliding shaft to slide along the second direction; the fifth mounting hole enables a sliding shaft in cooperation with the fifth mounting hole to rotate about an axis of the sliding shaft; and
   wherein the first connecting members are connected end-to-end in order in an arrangement direction of the middle sliding shaft group, and form a first connecting member group; the second connecting members are connected end-to-end in order along the arrangement direction of the middle sliding shaft group, and form a second connecting member group; and the first mounting hole and the fifth mounting hole are sleeved on a same sliding shaft.

2. The flexible device according to claim 1, wherein the number of the first connecting members in the first connecting member group is at least five, and the number of the second connecting members in the second connecting member group is at least four.

3. The flexible device according to claim 1, wherein the flexible device is configured to be bendable towards only one side, one edge of the first mounting hole extends beyond one edge portion in the direction perpendicular to the first direction of the second mounting hole, and another edge of the first mounting hole is leveled with another edge portion of the second mounting hole; one edge of the third mounting hole extends beyond one edge portion in the direction perpendicular to the second direction, of the fifth mounting hole, and another edge of the third mounting hole is leveled with another edge portion of the fourth mounting hole and another edge portion of the fifth mounting hole; and extending edges of the first mounting hole and the third mounting hole are towards a same side of the flexible device.

4. The flexible device according to claim 1, wherein the flexible device is configured to be bendable towards two sides; two edges of the first mounting hole respectively extend beyond two edge portions in the direction perpendicular to the first direction, of the second mounting hole; and two edges of the third mounting hole respectively extend beyond two edge portions in the direction perpendicular to the second direction, of the fifth mounting hole.

5. The flexible device according to claim 1, wherein the flexible device is configured to keep in any bent state.

6. The flexible device according to claim 5, wherein the connecting member group comprises third connecting members and fourth connecting members; the third connecting members have the same structure and arrangement as the first connecting members of the connecting member group, and each of the third connecting members and the corresponding first connecting member are sleeved on a same sliding shaft; the fourth connecting members have the same structure and arrangement as the second connecting members of the connecting member group, and each of the fourth connecting members and the corresponding second connecting member are sleeved on a same sliding shaft; two second mounting holes located at two ends of each of the third connecting members are configured to respectively provide a rotation damping to the sliding shafts corresponding to the two second mounting holes; and the fifth mounting holes of the fourth connecting member are configured to respectively provide a rotation damping to the sliding shafts corresponding to the fifth mounting holes.

7. The flexible device according to claim 6, wherein the flexible device further comprises a filling block, the filling block is sleeved on the sliding shaft, and is located between two connecting members spaced apart from each other in a connecting member group formed by the same kind of connecting members connected end-to-end.

8. The flexible device according to claim 5, wherein the second mounting holes at two ends of the first connecting member in the connecting member group are configured to respectively provide a rotation damping to the sliding shafts in cooperation with the second mounting holes; and the fifth mounting holes of the second connecting member in the connecting member group are configured to respectively provide a rotation damping to the sliding shafts in cooperation with the fifth mounting holes.

9. The flexible device according to claim 1, wherein one side of the flexible device is flat when the flexible device is unbent.

10. An electronic device, wherein the electronic device comprises a flexible screen and a flexible device configured to support the flexible screen, and the flexible device is the flexible device according to claim 1.

11. A flexible device, comprising:
   at least three shafts arranged parallel to each other; and
   a connecting member group comprising at least three holes respectively receiving the at least three shafts, and a first hole of the at least three holes being configured to allow a first shaft received therein of the at least three shafts to rotate about the axis of the first shaft and to move a first limited distance in the first hole.

12. The flexible device according to claim 11, wherein the first hole comprises a first opening space, a width of which is substantially equal to a diameter of the first shaft.

13. The flexible device according to claim 12, wherein the first limited distance is less than the difference between the diameter of the first shaft and a length of the first opening space.

14. The flexible device according to claim 13, wherein a second hole of the at least three holes being configured to allow a second shaft received therein of the at least three shafts to rotate about the axis of the second shaft and to move a second limited distance in the second hole.

15. The flexible device according to claim 14, wherein the second hole comprises a second opening space, a width of which is substantially equal to a diameter of the second shaft, and the second limited distance is less than the difference between the diameter of the second shaft and a length of the second opening space.

16. The flexible device according to claim 15, wherein a first extension direction of the length of the first opening space is different from a second extension direction of the length of the second opening space.

* * * * *